United States Patent
Higby et al.

(10) Patent No.: US 12,022,632 B2
(45) Date of Patent: Jun. 25, 2024

(54) TUNABLE TOLERANCE STACK-COMPLIANT LATCHING

(71) Applicant: INTERNATIONAL BUSINESS MACHINES CORPORATION, Armonk, NY (US)

(72) Inventors: Arthur J. Higby, Cottekill, NY (US); Camillo Sassano, Durham, NC (US); Christopher M. Marroquin, Rochester, MN (US); Brandon R. Christenson, Kasson, MN (US); Kevin O'Connell, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 167 days.

(21) Appl. No.: 17/710,994

(22) Filed: Mar. 31, 2022

(65) Prior Publication Data

US 2023/0320015 A1 Oct. 5, 2023

(51) Int. Cl.
*H05K 7/00* (2006.01)
*H05K 7/14* (2006.01)

(52) U.S. Cl.
CPC ......... *H05K 7/1409* (2013.01); *H05K 7/1489* (2013.01)

(58) Field of Classification Search
None
See application file for complete search history.

(56) References Cited

U.S. PATENT DOCUMENTS

| | | | |
|---|---|---|---|
| 4,322,101 A | 3/1982 | Kelly et al. | |
| 5,297,009 A | 3/1994 | Gelez et al. | |
| 5,575,163 A | 11/1996 | Kohl et al. | |
| 6,145,352 A | 11/2000 | Vickers et al. | |
| 6,229,708 B1 | 5/2001 | Corbin, Jr. et al. | |
| 10,485,123 B1* | 11/2019 | Lin | H05K 5/0221 |
| 10,939,573 B1* | 3/2021 | Liao | H01R 13/62983 |
| 10,945,348 B2 | 3/2021 | Wang | |
| 11,013,321 B2 | 5/2021 | Hashemi et al. | |
| 2016/1573761 | 6/2016 | Franz | |

FOREIGN PATENT DOCUMENTS

| | | |
|---|---|---|
| EP | 0530453 B1 | 8/2000 |
| GB | 903885 A | 8/1962 |
| GB | 1436912 A | 5/1976 |

OTHER PUBLICATIONS

International Search Report and Written Opinion issued Sep. 1, 2023 in related International Patent Application No. PCT/EP2023/057779, 17 pgs.

* cited by examiner

*Primary Examiner* — Anthony Q Edwards
*Assistant Examiner* — Rashen E Morrison
(74) *Attorney, Agent, or Firm* — Intelletek Law Group, PLLC; Gabriel Daniel, Esq.

(57) ABSTRACT

A latch assembly includes a lever arm affixed to a latch pivot point of rotation with a cam having a connecting slot. A load mechanism is configured to apply a force on the latch pivot point to retain the lever arm in a first position. The load mechanism is tuned to apply the force along a tolerance range of operation of the latch assembly.

19 Claims, 9 Drawing Sheets

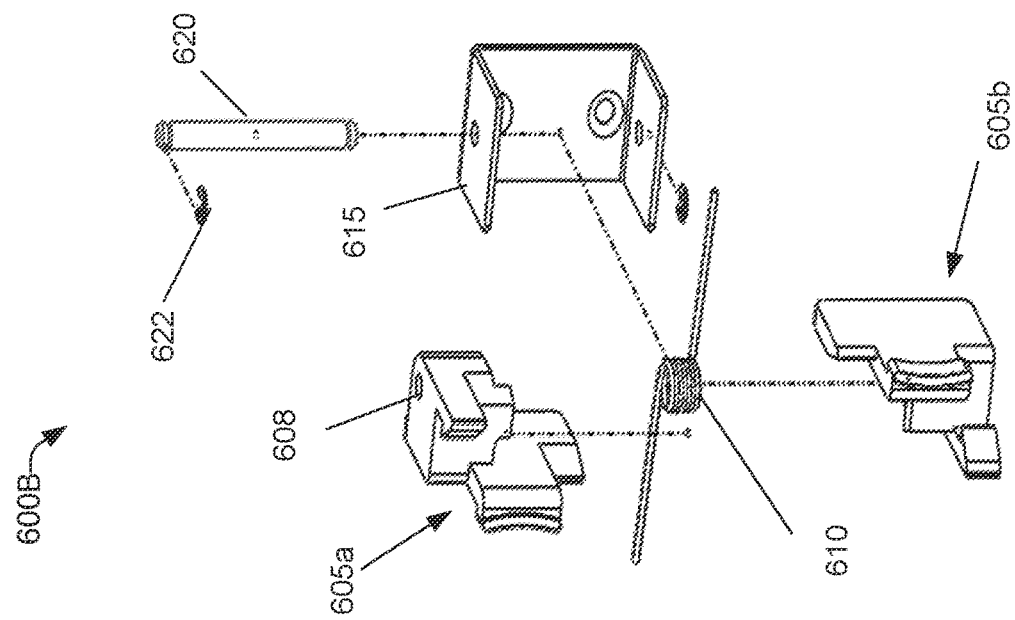
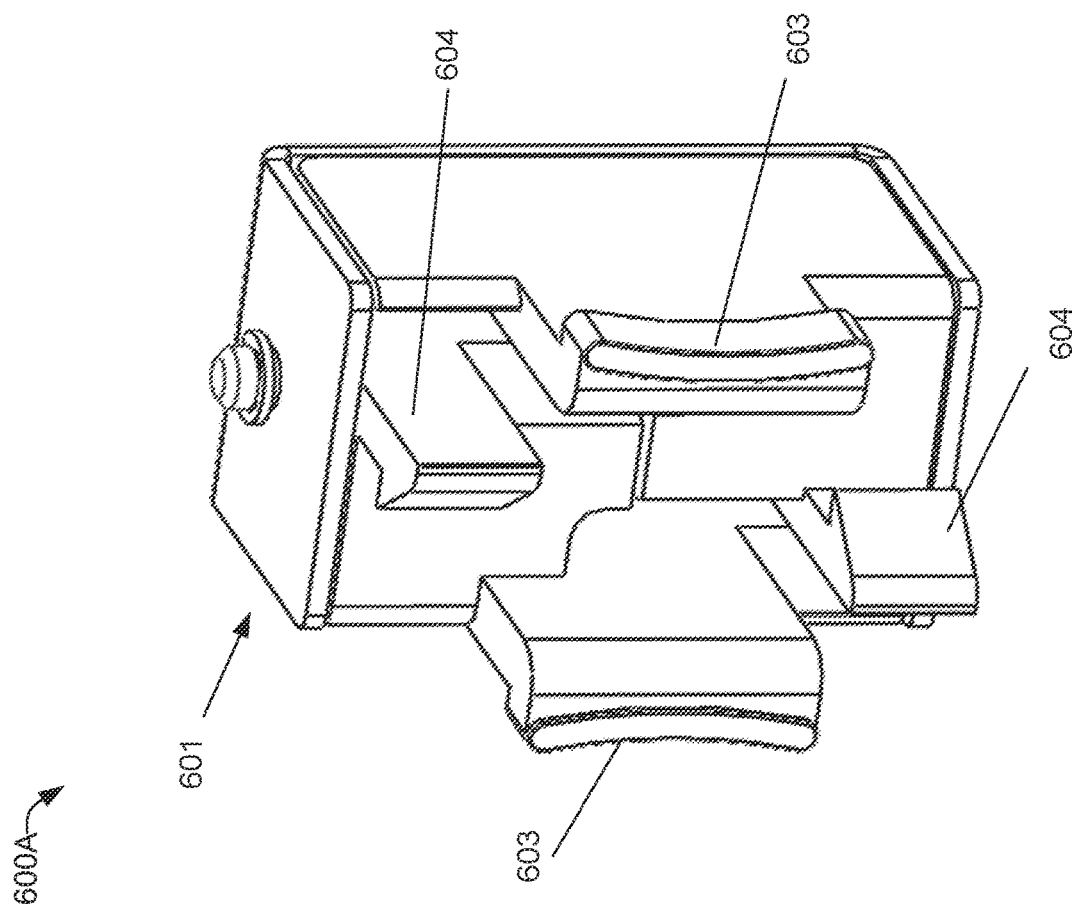

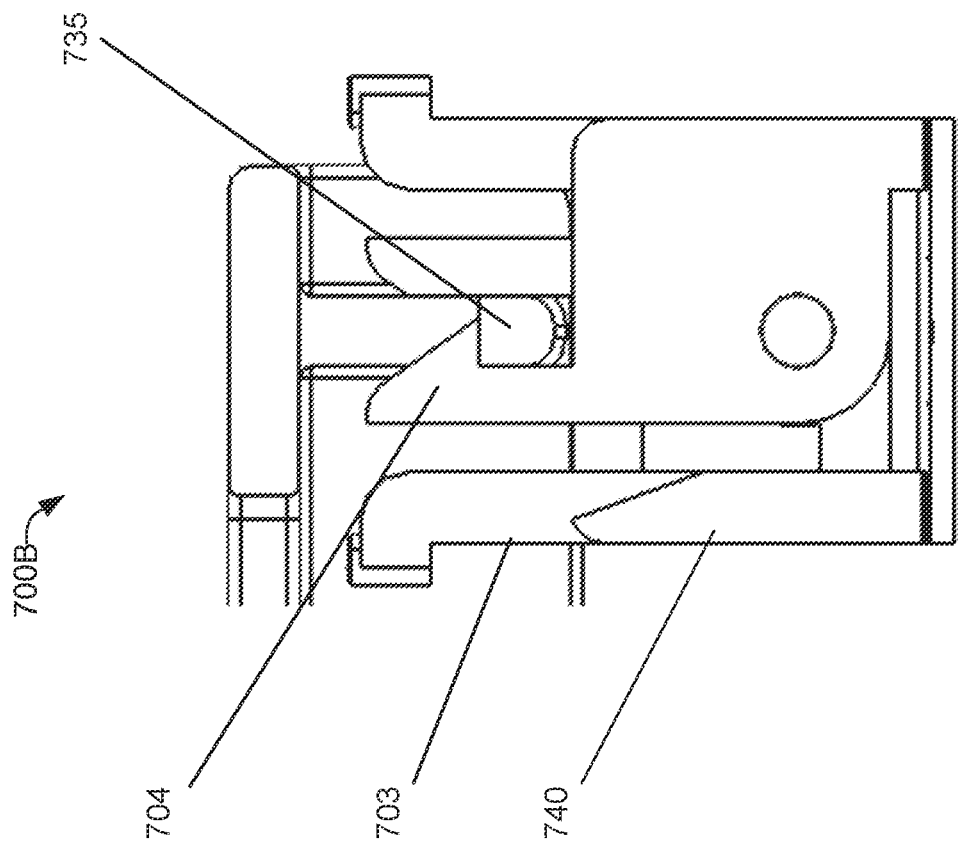
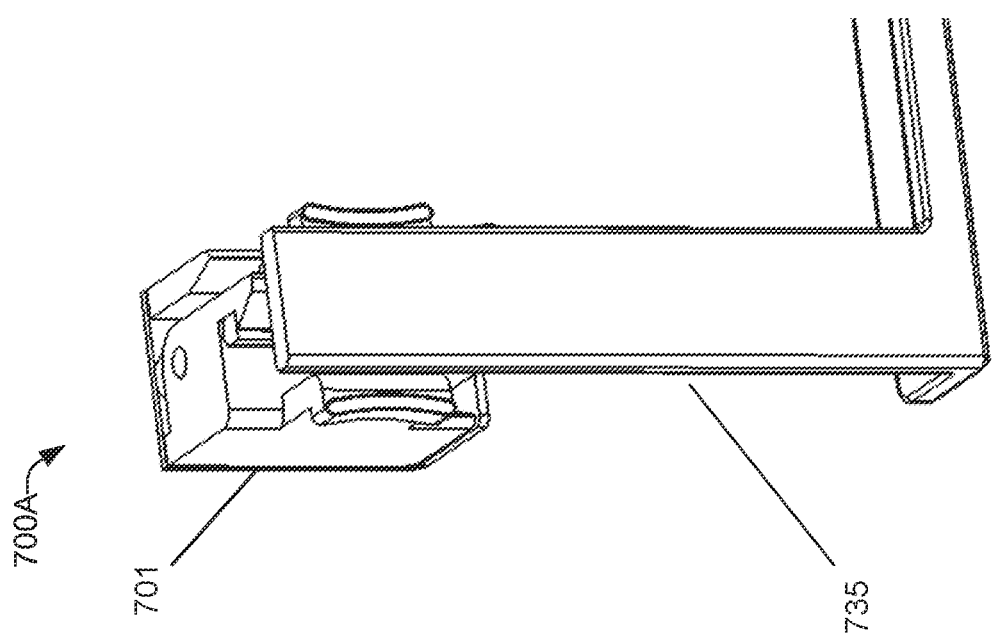
FIG. 7B
FIG. 7A

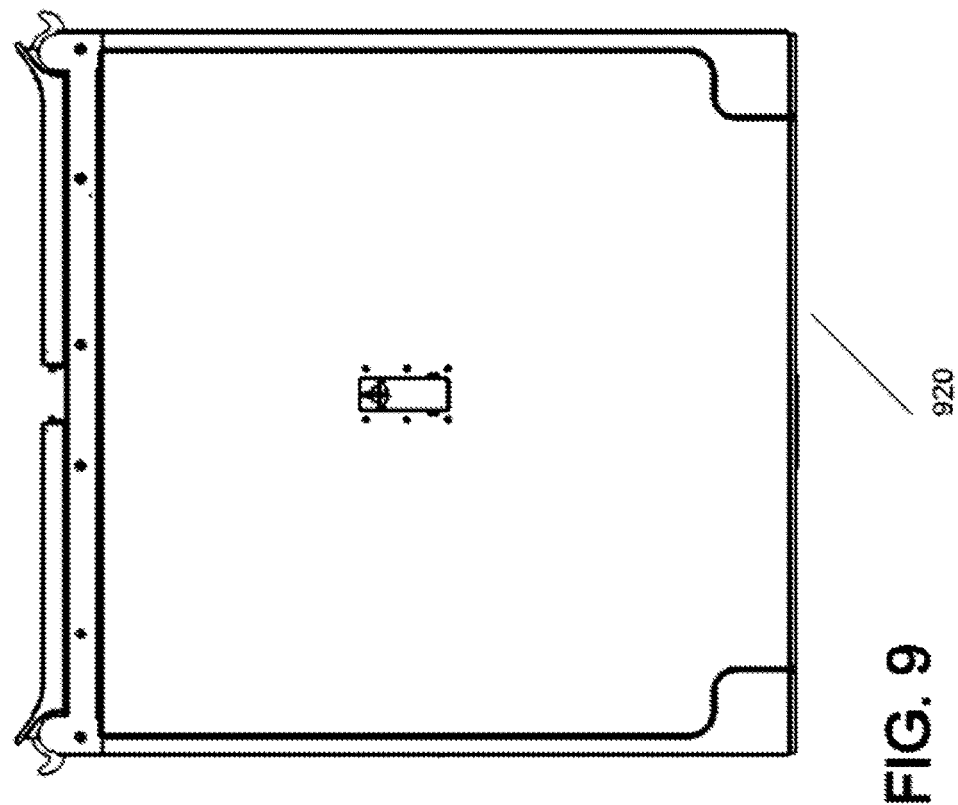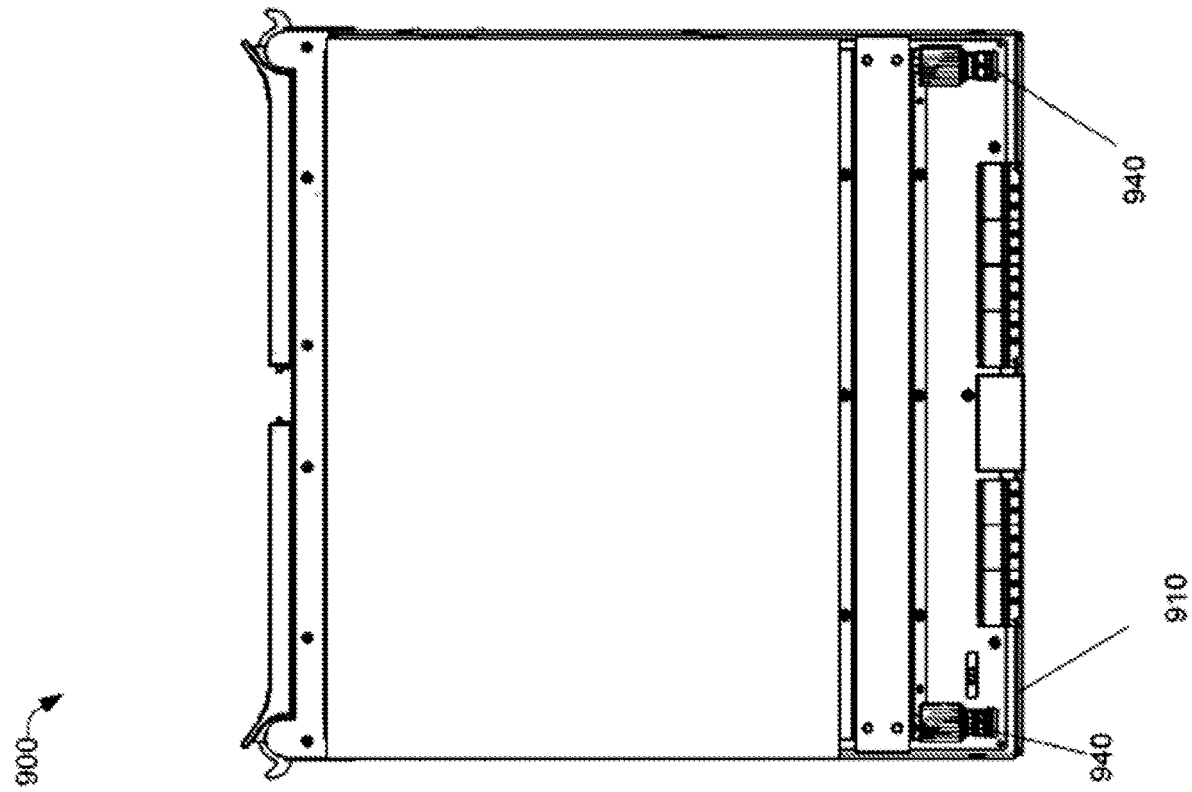
FIG. 9

TUNABLE TOLERANCE STACK-COMPLIANT LATCHING

BACKGROUND

Technical Field

The present disclosure generally relates to liquid cooling fittings and electrical connectors, and more particularly, to stack compliant latching of components to backplanes of electronic equipment.

Description of the Related Art

The use of a backplane in electronic devices such as computer devices including, but not limited to, server racks etc., provides for more stable connections for cards that are designed for connection to the backplane at various predetermined insertion forces. The cards are kept in place at predetermined retention force(s). Latches are typically used to secure the cards to the backplane.

Various types of plug-in equipment with connectors have distinct insertion forces for arrangement on a backplane. In addition to electrical connectors, there may be the addition of component-level water cooling having liquid cooling fittings that connect to the same backplane. The retention forces of various electrical connectors may also vary, as well as those of liquid cooling fittings. There are problems with designing a latch assembly that can securely provide a proper force to connect the various types of electrical connectors and cooling fittings to a backplane because the variance in such force requirements is significant. Damage can occur from the application of pressure outside the recommended range, and some connectors may not have a sufficient connection force applied. Different retention force ranges may also cause poor connector performance from the lack of a snug connection to the backplane. Another challenge is that the differences in travel distance for some electrical connectors, particularly when compared with a travel distance for cooling fittings, can contribute toward a shorter lifecycle for such equipment. The relatively short length of the camming action of known latches only serves to compound the aforementioned connection problems. In addition, the sometimes large amount of force applied to latch assemblies to secure connectors in place can create a safety hazard when such latch assemblies are subsequently released to remove a card from a drawer or a drawer from a cage when servicing a computer rack.

SUMMARY

In one embodiment, a latch assembly includes a lever arm affixed to a latch pivot point of rotation with a cam. A load mechanism is configured to apply a force on the latch pivot point to retain the lever arm in a first position. The load mechanism is tuned to apply the force along a tolerance range of operation of the latch assembly. The tunability of the load mechanism provides an advantage to securing the connection of plug-in equipment having both liquid cooling fittings and electrical connectors because the different types of connectors generate distinctly different insertion forces, as well as vastly different travel actions.

In an embodiment, the load mechanism includes a latch mount and a plurality of alignment pins attached to the latch mount. One or more biasing elements having a first end are arranged along the alignment pins. A loading block is attached to the cam, the loading block having a plurality of recesses to receive a second end of the one or more biasing elements. A pivot pin and clips are arranged to attach the loading mechanism to the cam via the connecting slot to pivotally attach the loading block to the cam. The use of biasing elements that are aligned into a loading block advantageously provides for a tunable amount of pressure to be translated from latch mount through to a backplane connection.

In an embodiment, the latch assembly includes two lever arms and two cams, and a respective cam of each lever arm is attached to the pivot pin. The one or more biasing elements can be compression springs.

In an embodiment, the cam is sized to have a length of motion to provide a uniform peak plug force translated to a connector of a card drawer.

In an embodiment, the cam is sized to provide a predetermined travel distance during application of a force ranging from a peak force to a fully plugged force for a first connector of a card drawer attached to the latch assembly to a second connector of a backplane. The predetermined travel distance provides a mechanical advantage to provide the peak plug force in a uniform manner.

In an embodiment, the predetermined travel distance of the cam is additionally based on a connection distance of liquid cooling fittings of the card drawer to fittings on the backplane.

In an embodiment, each of the plurality of recesses have a cavity depth that is configured to tune the force applied by the one or more compression springs of the load mechanism.

In an embodiment, each of the plurality of recesses has a cavity depth that is configured to tune the force applied by the load mechanism based on a modification to a size of the one or more compression springs.

In an embodiment, the force applied by the load mechanism is tuned to translate to a predetermined range from a first connector on a card in a drawer attached to the latch assembly to a second connector on a backplane of a card cage assembly.

In an embodiment, the load mechanism is tuned to provide a retention force at an amount to keep a blind dock quick connect (QC) connector fully plugged to allow water to flow through.

In one embodiment, a safety slam-latch mechanism includes a biasing element, a latch lock mechanism including two hooks under tension from the biasing element. A first hook is a latch having one end with a first latch retention surface and another end with a first release surface. A second hook is a latch release having one end with a second latch retention surface and another end with a second release surface. The first release surface and the second release surface are configured to move the first latch retention surface and the second retention surface in an opposite direction of a movement of the first release surface and the second release surface to unlock and release the latch. This construction prevents an accidental activation of the latch and controls the movement of a lever handle captured by the safety slam-match mechanism because a pinching action of both the first release surface and the second release surface is used to release the lever handle. The pinching action directs any force on the biasing element to go into a user's palm. The safety slam-latch mechanism as shown and described herein provides an advantage over conventional latch mechanisms in which the free rotation of a lever handle upon release is sometimes a cause of injury.

In an embodiment, the biasing element is a torsion spring, and the first hook and the second hook are substantially identical parts rotated approximately 180 degrees under tension from the torsion spring.

In an embodiment, the first latch retention surface and the second latch retention surface are positioned on an inner portion of the safety slam-latch, and the first release surface and the second release surface are positioned on an outer portion of the safety slam-latch relative to the first latch reunion surface and the second latch retention surface.

In an embodiment, the first latch retention surface and the second latch retention surface are configured to receive and retain a handle of a lever.

In an embodiment, the first latch retention surface and the second latch retention surface are configured to retain an extruded portion of the lever.

In an embodiment, the first latch retention surface and the second latch retention surface are configured to move apart and release the handle of a lever in response to a pinching of both the first release surface and the second release surface.

In an embodiment, the safety slam-latch includes a mounting bracket on which the torsion spring and the latch lock mechanism are arranged.

In an embodiment, the safety slam-latch includes a pivot pin, and wherein each of the two hooks of the latch lock mechanism include a mounting portion having an opening in which the pivot pin is arranged to pivotally secure the latch lock mechanism to the mounting bracket.

In an embodiment, the mounting bracket is configured for mounting to a drawer of a drawer and cage assembly.

In an embodiment, the latch lock mechanism is configured for bi-directional movement.

These and other features will become apparent from the following detailed description of illustrative embodiments thereof, which is to be read in connection with the accompanying drawings.

BRIEF DESCRIPTION OF THE DRAWINGS

The drawings are of illustrative embodiments. They do not illustrate all embodiments. Other embodiments may be used in addition to or instead. Details that may be apparent or unnecessary may be omitted to save space or for more effective illustration. Some embodiments may be practiced with additional components or steps and/or without all the components or steps that are illustrated. When the same numeral appears in different drawings, it refers to the same or like components or steps.

FIG. 6A depicts a perspective view of a safety slam-latch mechanism and FIG. 6B depicts an exploded view, consistent with an illustrative embodiment.

FIG. 7A depicts a lever handle captured by the safety slam-latch mechanism and FIG. 7B depicts a plan view of the mechanism of FIG. 7A, consistent with an illustrative embodiment.

FIG. 9 shows drawers that may be housed by the cage in FIG. 8, consistent with an illustrative embodiment.

DETAILED DESCRIPTION

Overview

Figure 1:
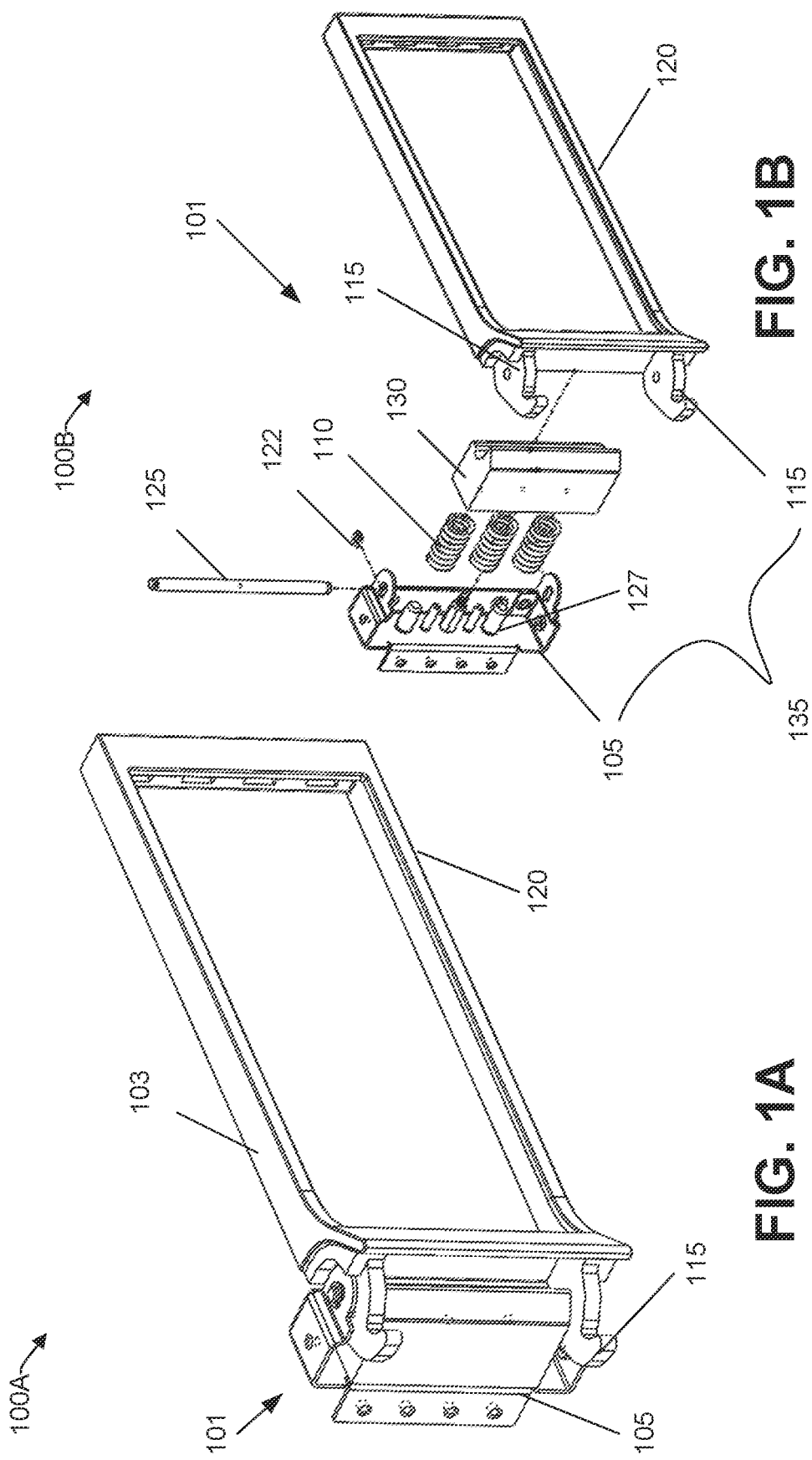
FIG. 1A is a perspective view of a tunable latch assembly, consistent with an illustrative embodiment.
FIG. 1B is an exploded view of the latch assembly shown in FIG. 1A.

In the following detailed description, numerous specific details are set forth by way of examples to provide a thorough understanding of the relevant teachings. However, it should be understood that the present teachings may be practiced without such details. In other instances, well-known methods, procedures, components, and/or circuitry have been described at a relatively high level, without detail, to avoid unnecessarily obscuring aspects of the present teachings. It is to be understood that the present disclosure is not limited to the depictions in the drawings, as there may be fewer elements or more elements than shown and described.

As used herein, the term "biasing element" refers to any component that provides a force including, but not limited to, a spring. Although coil springs and torsion springs are shown, the claimed subject matter is not limited. For example, leaf springs or other adequate structures may provide the biasing.

The claimed subject matter is directed to inventive concepts that may be practiced separately or in unison. For example, some of the claimed subject matter is directed to a latch assembly with a camming action and a tunable preload. There is also claimed subject matter directed to a retaining mechanism (referred to herein as a "safety slam-latch mechanism") configured to keep a lever in a closed position and allow for a safe unlocking. It is to be understood that the safety slam latch mechanism is not limited to operation with the lever shown and described herein.

There is a challenge to provide various types of plug-in equipment with connectors having distinct insertion forces for arrangement on a backplane. In addition to electrical connectors, the addition of component-level water cooling uses liquid cooling fittings (e.g., 940 in FIG. 9) that connect to the same backplane. The retention forces of various electrical connectors may also vary, as well as those of liquid cooling fittings. A secure connection of both liquid cooling fittings and electrical connectors are provided by the latch assembly and slam-latch safety mechanism according to illustrative embodiments described herein.

Figure 8:
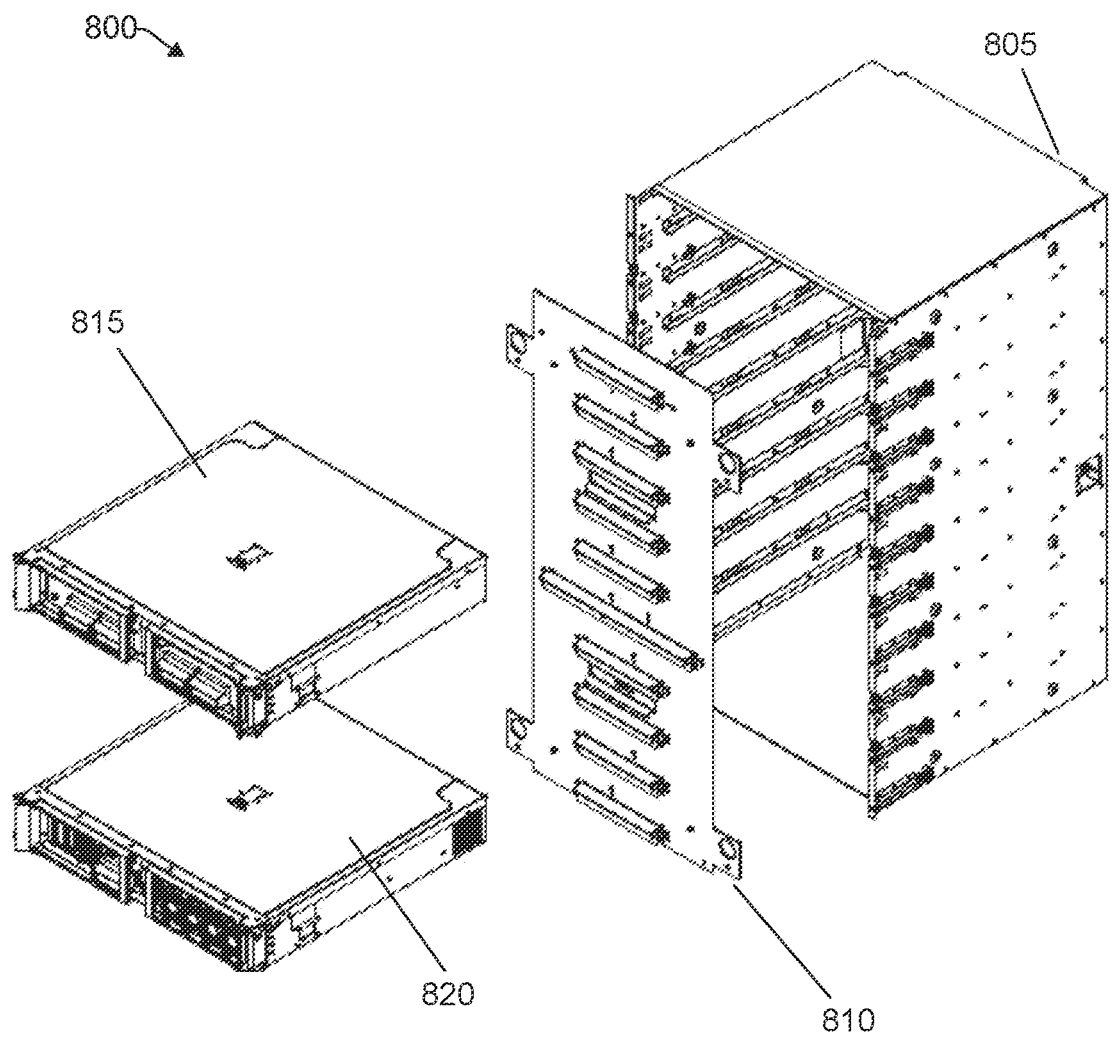
FIG. 8 shows a cage and drawer assembly, consistent with an illustrative embodiment.

FIG. 8 shows an exploded view of a non-limiting example of a drawer and cage assembly 800 which may include a lever with a camming action and tunable preload according to the present disclosure, and/or a safety slam latch mechanism according to the present disclosure. The cage and drawer assembly 800 may be a computer server rack, but may include any structure that houses a back plane. There is shown a cage 805, a backplane 810, and drawers 815, 820. The drawers 815, 820 are slidable into the cage and connect to the backplane 810. As discussed herein below, a latch assembly mechanism and a safety slam-latch mechanism according to illustrative embodiments described herein below are configured to connect with back planes of various types of electronic devices. The drawers 815, 820 may include components having electrical connectors, and may further include fittings for cooling connections.

The latch assembly, according to some illustrative embodiments herein, addresses challenges of insertion force, travel distance, preload for connector wear prevention, and a tolerance stack so that a correct load is applied at times to the backplane. For example, there is a challenge to securing connection of plug-in equipment having both liquid cooling fittings and electrical connectors because the different construction of such connectors generates distinctly different insertion forces, as well as vastly different travel actions. Accordingly, a clamping mechanism such as the latch assembly according to certain embodiments of the present disclosure is configured to provide one or more of longer cam-in actions, sufficient mechanical advantage to overcome connector resistance, a pre-load to prevent connector wear due to vibration, and compliance with tolerance stack requirements. There is also a desirability to use off-the-shelf hydraulic fittings to connect the drawers to the backplane.

Alternatively, or in addition thereto, a safety slam-latch mechanism according to some illustrative embodiments herein is configured to lock a lever into place (not limited to the latch assembly shown and described herein). The safety slam latch mechanism includes a latch lock is configured to unlock and release by a pinching of two edges of the latch such that any force on the spring goes into the user's palm. A catching part is used twice and kept under tension by a torsion spring.

Additional teachings of the latch assembly and/or the bidirectional safety slam-latch mechanism according to illustrative embodiments of the present disclosure are disclosed herein.

Example Latch Assembly

FIG. 1A is a perspective view 100A of a latch assembly 101 of the present disclosure and FIG. 1B is an exploded view 100B of the latch assembly 100, consistent with an illustrative embodiment. The latch assembly 101 provides an adjustable application of the peak plug force for various plugs in a uniform manner by a latch mount 105 built into the lever hinge 135 using springs, pins, and slots so that different nodes can be plugged into the same backplane while providing different spring force loads. The quantity of springs may be varied (e.g., by omitting one or more springs from the loading block). The latch mount 105 includes alignment pins 127, compression springs 110, and slots 240 (shown in FIG. 2) in the loading block 130. The latch mount 105 creates a load on a latch pivot point pin 125 and provides a predetermined force that is accurate for a full tolerance range in which the latch functions. Clips 122 vertically restrain the pivot pin point 125 within the loading block 130. The latch assembly 100A includes a rigid latch having a lever arm 120 that pivots a cam 115.

With continued reference to FIGS. 1A and 1B, the compression springs 110, which may be arranged via alignment pins 127, provide a tunable preload. The compression springs 110 may be selected for a particular bias to provide pressure against the latch mount 105 and the loading block 130. The compression springs 110 assist in maximizing a length of the camming to provide a mechanical advantage that provides a peak plug force in a uniform manner. The latch assembly 101 is constructed so that cables, connectors and removable components are accessible and serviceable while a chassis is plugged. In an embodiment, a spring in the loading block is modifiable to change the force asserted to keep a particular plug attached to the backplane.

Figure 2:
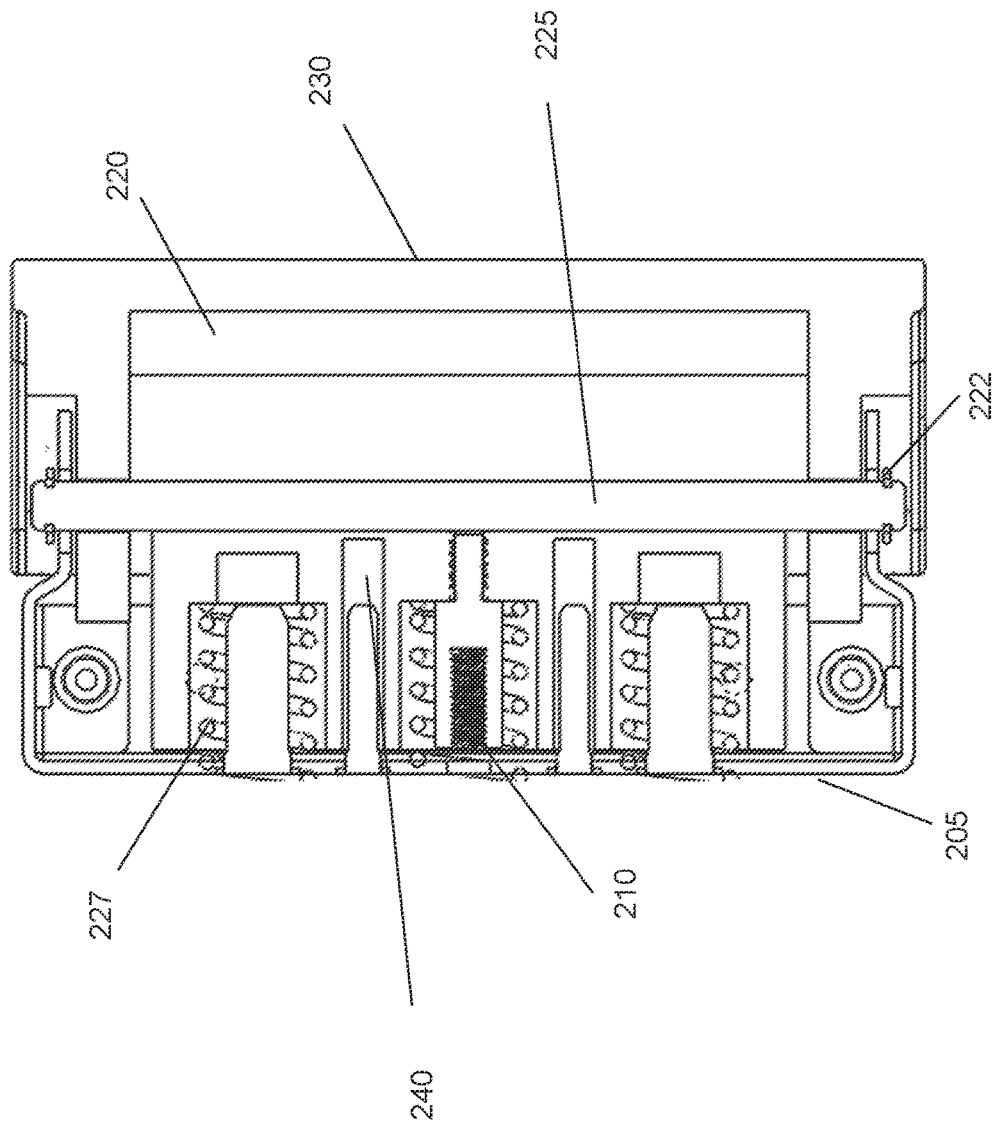
FIG. 2 illustrates a side view of the load mechanism and lever arm, consistent with an illustrative embodiment.

FIG. 2 illustrates a side view 200 of the load mechanism and lever arm, consistent with an illustrative embodiment. The load mechanism is assembled such that the latch mount 205 is attached to the loading block 230 by a pivot pin 225. The pivot pin 225 is held by clips 222. Alignment pins 227 and a compression spring 210 is shown. The lever 220, which is part of a rigid latch is shown.

Figure 3:
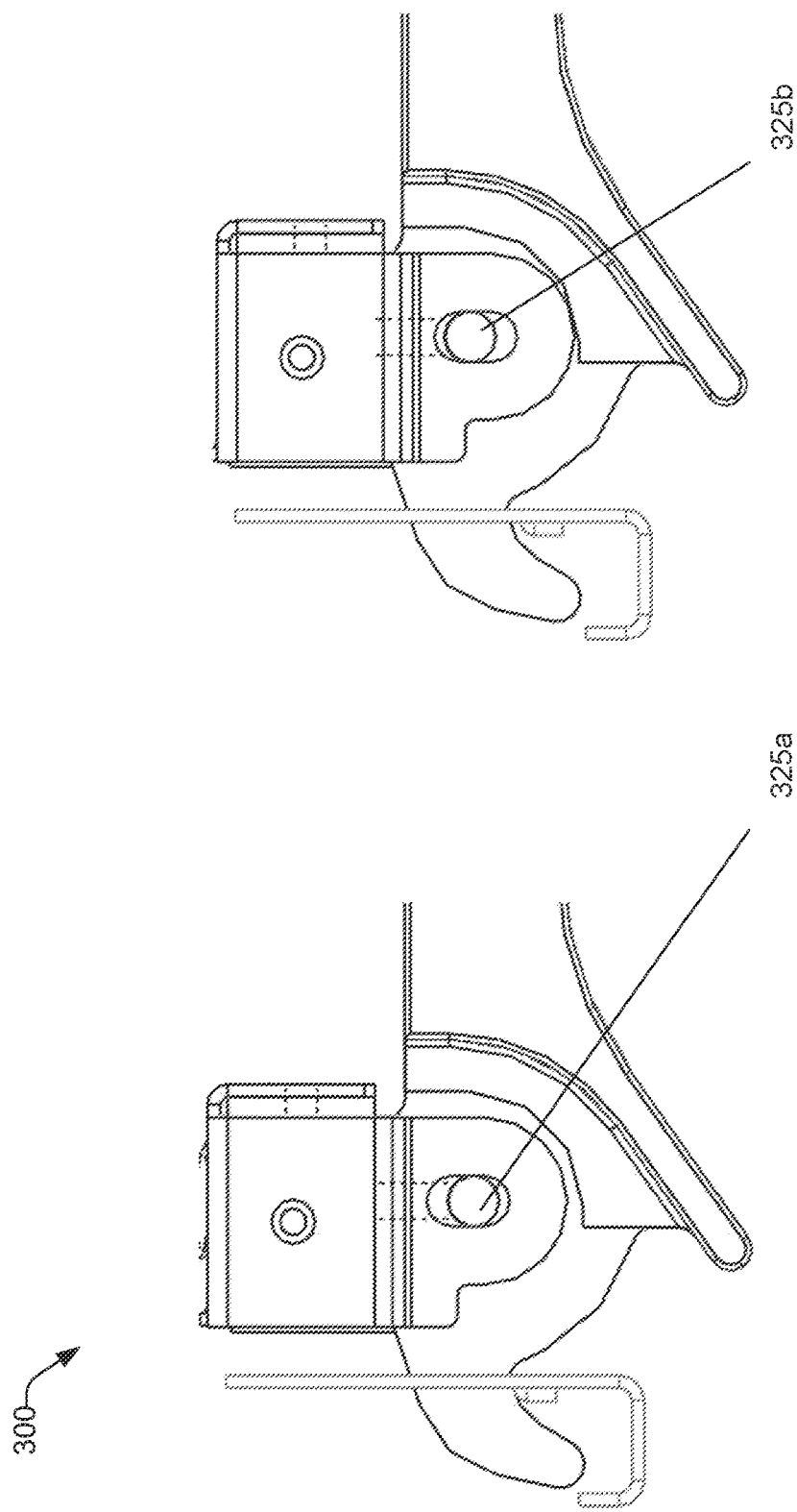
FIG. 3 is view of the camming action by a lever arm, consistent with an illustrative embodiment.

FIG. 3 is top view 300 of the camming action by a lever arm, consistent with an illustrative embodiment. It can be seen that the pivot pin 325a is at a first position within the slot in the latch mount, and because of the camming action the pin 325b is at a second position.

Figure 4:
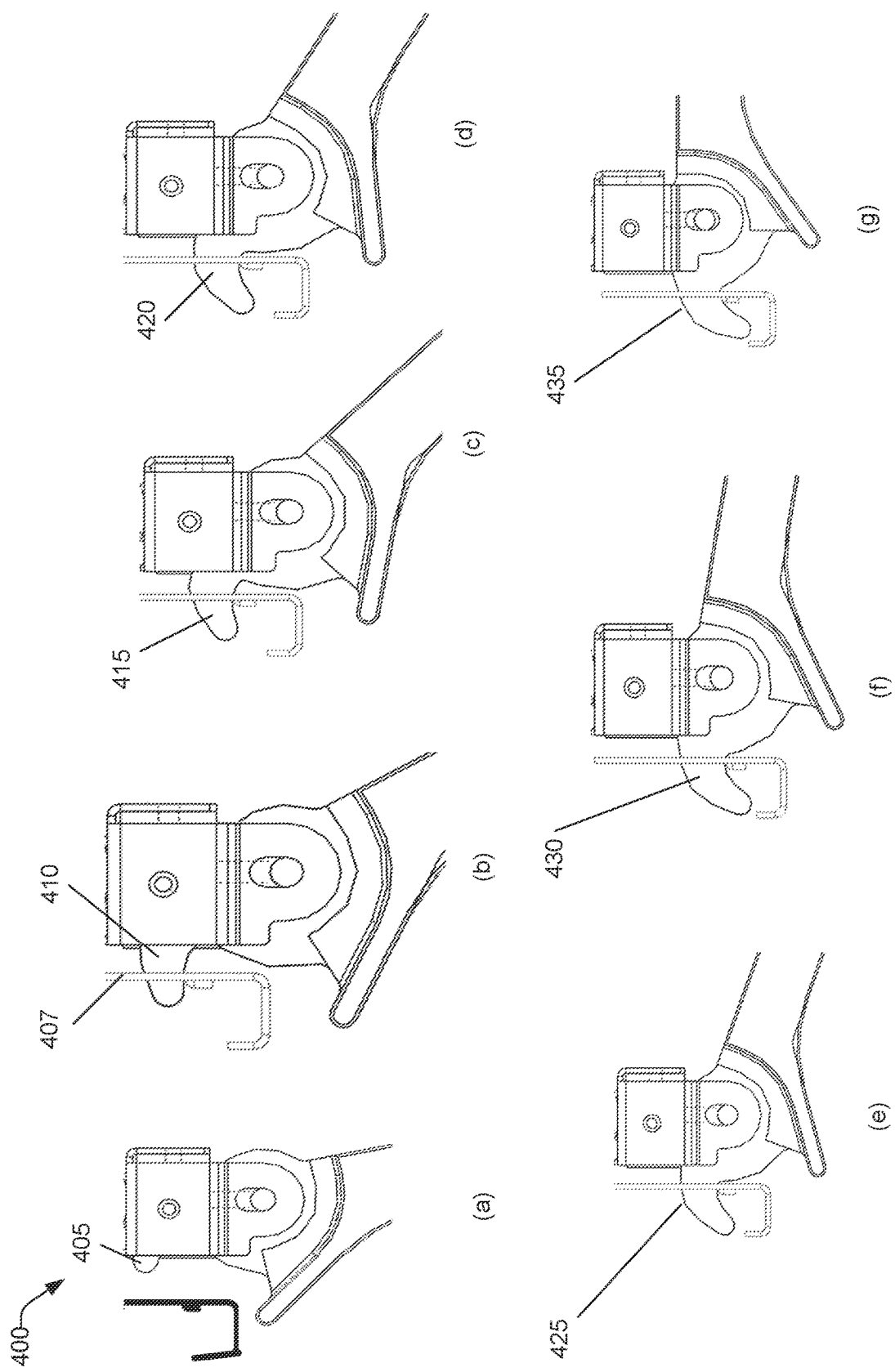
FIG. 4 shows a series of different angles of the latch assembly mechanism, consistent with an illustrative embodiment.

FIG. 4 shows a series of different angles of the latch assembly mechanism, consistent with an illustrative embodiment. For example, in 4(a) the latch 405 is open at approximately 78 degrees and the pin is located at the end of the slot. The latch is not engaged with the card cage 407. In 4(b) the latch 410 is open at approximately 60 degrees and the pin is located at the end of the slot the tip of the latch is engaged with an opening in the card cage. In 4(c) the latch 415 is opened at 45 degrees, and in 4(d) the latch 420 is opened at 30 degrees. It is shown that the finger of latch continues to extend in the card cage as the angle decreases. For example, in 4(e) the latch 425 is open 20 degrees, then at 4(f) the latch 430 is open 10 degrees, and finally in 4(g) the latch 435 is closed. It is also shown that the pin is now at the center of the slot, and there was 8.65 mm of travel while the cam is engaged.

Figure 5:
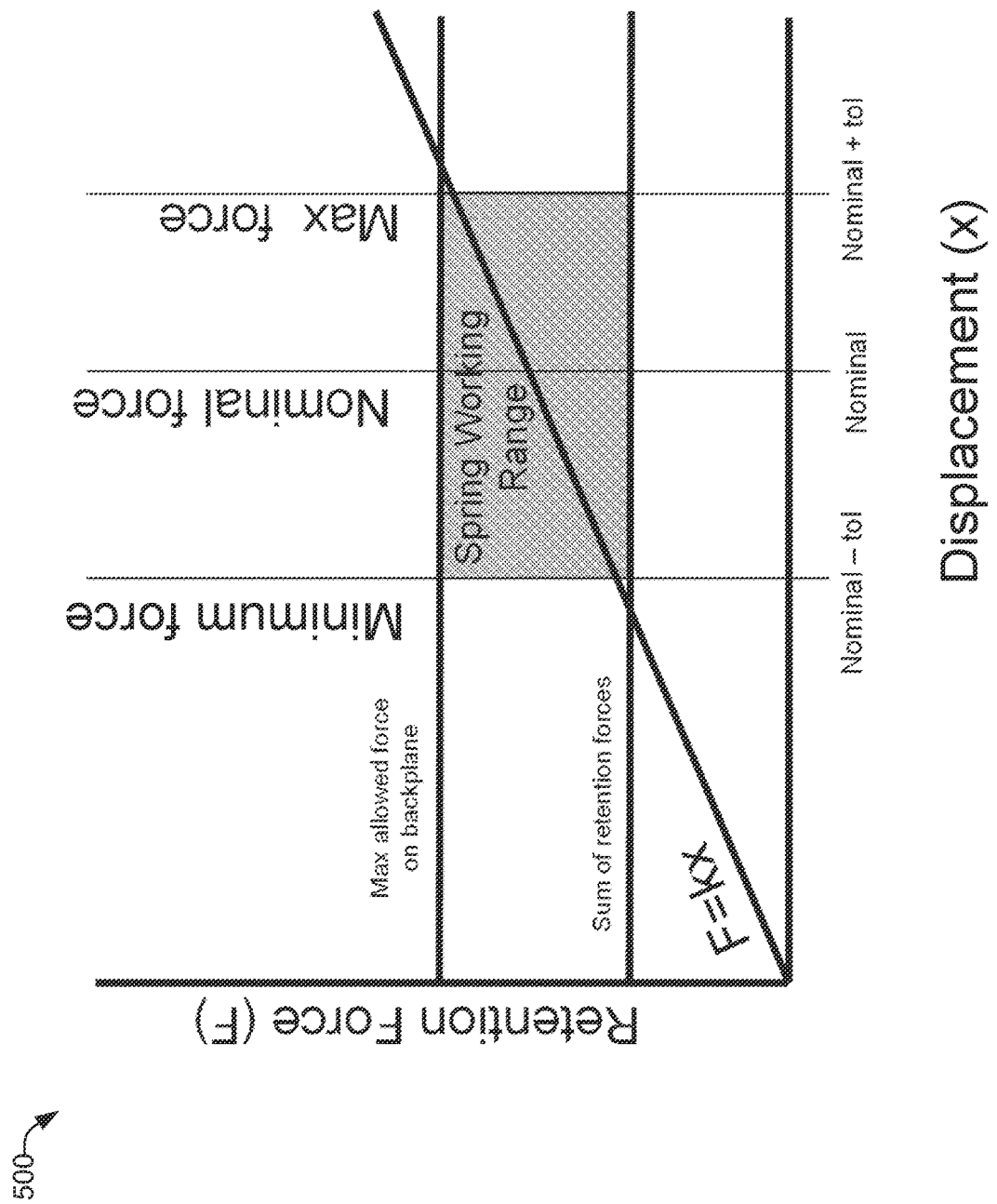
FIG. 5 is a graph showing retention force versus displacement for spring selection, consistent with an illustrative embodiment.

FIG. 5 is a graph showing retention force (F) versus displacement (x) for spring selection, consistent with an illustrative embodiment. The springs can be chosen such that a minimum plug force load will be large enough to fully plug the connectors in all situations. The "max force" shown in the graph should be below a specific threshold so that there is not a force introduced onto the mating connector that causes any damage or unwanted displacement. The shaded area is the spring working range between the sum of retention force and the max force allowed on a backplane. A nominal (minus a tolerance), a nominal, and a nominal (plus tolerance), which are shown as a minimum force, nominal force. F=Kx is the force of a spring.

Bi-Directional Safety Slam-Latch Mechanism

FIG. 6A depicts a perspective view 600A of a safety slam-latch mechanism 601 and FIG. 6B depicts an exploded view 600B, consistent with an illustrative embodiment. The safety slam-latch mechanism prevents injury from the release of a lever handle at a high force. A lever 735 (shown in FIGS. 7A and 7B) is locked into place by the slam-latch mechanism. There are two hooks 605a, 605b that may be an identical or substantially identical part rotated 180 degrees, and kept under tension by a biasing element such as a torsion spring 610. The profile of the hooks can be configured such that the lever can be pushed into the latch (FIGS. 7A and 7B) and be automatically retained from two separate elements moving from opposite directions. A mounting bracket 615 houses the two hooks 605a, 605b and torsion spring 610 by a pivoting pin 620 and clips 622. There is an opening 608 in each of the hook assembly to receive the pin 620 so as to be pivotally secured to the mounting bracket. The mounting bracket may be attached to a card drawer of a drawer and cage assembly. The slam-latch mechanism includes latch retention surfaces 604, and latch release surfaces 603, which are pinched to release the handle. In one embodiment, the latch is constructed so that it can only be released using two fingers in a pinching motion. This construction prevents accidental activation of the latch and controls the movement of the lever. The lever, when released, will stop against the palm of the hand, instead of rotating freely and possible causing injury.

FIG. 7A depicts a perspective view 700A of the slam-latch mechanism 701 that has captured a lever handle 735 consistent with an illustrative embodiment. FIG. 7B depicts a plan view 700B of the mechanism of FIG. 7A, consistent with an illustrative embodiment. The lever handle 735 is captured by the latch retention surfaces 704. To release the lever handle 735 from the slam-latch mechanism, a pinching of the latch release surfaces 703 causes the latch retention surfaces 704 to move apart and the latch handle 735 will move away toward the palm of a user pinching the latch release surfaces. The pinching action of the two latch release surface 703, through the use of two fingers, positions the palm of the user sufficiently close to prevent the lever handle 735 from shooting outward and possibly causing an injury.

FIG. 9 shows a plan view 900 of drawers 910, 920 that may be housed by the cage in FIG. 8, consistent with an illustrative embodiment. The drawers are secured in the cage by the slam-latch mechanism as described herein above.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications, and variations that fall within the true scope of the present teachings.

The components, operations, steps, features, objects, benefits, and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently.

The flowchart, and diagrams in the figures herein illustrate the architecture, functionality, and operation of possible implementations according to various embodiments of the present disclosure.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any such actual relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments have more features than are expressly recited in each claim. Rather, as the following claims reflect, the inventive subject matter lies in less than all features of a single disclosed embodiment. Thus, the following claims are hereby incorporated into the Detailed Description, with each claim standing on its own as a separately claimed subject matter.

What is claimed is:

1. A latch assembly comprising:
   a lever arm affixed to a latch pivot point of rotation with a cam having a connecting slot; and
   a load mechanism configured to apply a force on the latch pivot point to retain the lever arm in a first position, wherein the load mechanism is tuned to apply the force along a tolerance range of operation of the latch assembly,
   wherein the force applied by the load mechanism is tuned to translate to a predetermined range from a first connector on a card in a drawer attached to the latch assembly to a second connector on a backplane of a card cage assembly.

2. The latch assembly according to claim 1, wherein the load mechanism comprises:
   a latch mount;
   a plurality of alignment pins attached to the latch mount;
   one or more biasing elements having a first end arranged along the alignment pins;

a loading block attached to the cam, the loading block having a plurality of recesses to receive a second end of the one or more compression springs; and a pivot pin and clips arranged to attach the loading mechanism to the cam via the connecting slot to pivotally attach the loading block to the cam.

3. The latch assembly according to claim 2, further comprising two lever arms and two cams, wherein:

a respective cam of each lever arm is attached to the pivot pin, and the one or more biasing elements comprising one or more compression springs.

4. The latch assembly of claim 3, wherein the cam is sized to have a length of motion to provide a uniform peak plug force translated to a connector of a card drawer.

5. The latch assembly of claim 3, wherein the cam is sized to provide a predetermined travel distance during application of a force ranging from a peak force to a fully plugged force of a first connector of a card drawer attached to the latch assembly to a second connector of a backplane.

6. The latch assembly of claim 5, wherein the predetermined travel distance of the cam is additionally based on a connection distance of liquid cooling fittings of the card drawer to fittings on the backplane.

7. The latch assembly according to claim 3, wherein each of the plurality of recesses having a cavity depth that is configured to tune the force applied by the load mechanism based on a modification to a size of the one or more compression springs.

8. The latch assembly according to claim 1, wherein the load mechanism is tuned to provide a retention force in an amount to keep a blind dock quick connect (QC) connector fully plugged to allow water to flow through.

9. A latch assembly comprising:

a lever arm affixed to a latch pivot point of rotation with a cam having a connecting slot; and a load mechanism configured to apply a force on the latch pivot point to retain the lever arm in a first position, wherein the load mechanism is tuned to apply the force along a tolerance range of operation of the latch assembly;

wherein the load mechanism comprises:

a latch mount;

a plurality of alignment pins attached to the latch mount;

one or more biasing elements having a first end arranged along the alignment pins;

a loading block attached to the cam, the loading block having a plurality of recesses to receive a second end of the one or more compression springs; and a pivot pin and clips arranged to attach the loading mechanism to the cam via the connecting slot to pivotally attach the loading block to the cam; and wherein each of the plurality of recesses having a cavity depth that is configured to tune the force applied by the one or more compression springs of the load mechanism.

10. A safety slam-latch mechanism, comprising:

a biasing element;

a latch lock mechanism comprising two hooks under tension from the biasing element; and a first hook comprising a latch having one end with a first latch retention surface and another end with a first release surface; and a second hook comprising a latch release having a one end with a second latch retention surface and another end with a second release surface, wherein the first release surface and the second release surface are configured to move the first latch retention surface and the second retention surface in an opposite direction of a movement of the first release surface and the second release surface, to unlock and release the latch.

11. The safety slam-latch according to claim 10, wherein:

the biasing element comprises a torsion spring, and the first hook and the second hook are substantially identical parts rotated 180 degrees under tension from the torsion spring.

12. The safety slam-latch according to claim 10, wherein:

the first latch retention surface and the second latch retention surface are positioned on an inner portion of the safety slam-latch, and the first release surface and the second release surface are positioned on an outer portion of the safety slam-latch relative to the first latch reunion surface and the second latch retention surface.

13. The safety slam-latch according to claim 10, wherein the first latch retention surface and the second latch retention surface are configured to receive and retain a handle of a lever.

14. The safety slam-latch according to claim 13, wherein the first latch retention surface and the second latch retention surface are configured to retain an extruded portion of the lever.

15. The safety slam-latch according to claim 13, wherein the first latch retention surface and the second latch retention surface are configured to move apart and release the handle of a lever in response to a pinching of both the first release surface and the second release surface.

16. The safety slam-latch according to claim 11, further comprising a mounting bracket on which the torsion spring and the latch lock mechanism are arranged.

17. The safety slam-latch according to claim 16, further comprising a pivot pin, and wherein each of the two hooks of the latch lock mechanism further comprise a mounting portion having an opening in which the pivot pin is arranged to pivotally secure the latch lock mechanism to the mounting bracket.

18. The safety slam-latch according to claim 16, wherein the mounting bracket is configured to mount to a drawer of a drawer and cage assembly.

19. The safety slam-latch according to claim 10, wherein the latch lock mechanism is configured to move bi-directionally.

* * * * *